(12) United States Patent
Burnett et al.

(10) Patent No.: US 8,283,244 B2
(45) Date of Patent: Oct. 9, 2012

(54) METHOD FOR FORMING ONE TRANSISTOR DRAM CELL STRUCTURE

(75) Inventors: James D. Burnett, Meylan (FR); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 342 days.

(21) Appl. No.: 12/558,284

(22) Filed: Sep. 11, 2009

(65) Prior Publication Data

US 2010/0001326 A1    Jan. 7, 2010

Related U.S. Application Data

(62) Division of application No. 11/554,851, filed on Oct. 31, 2006, now Pat. No. 7,608,898.

(51) Int. Cl.
*H01L 21/44* (2006.01)
(52) U.S. Cl. . 438/571; 438/581; 438/583; 257/E29.271; 257/384
(58) Field of Classification Search .......... 438/571, 438/581, 583; 365/149; 257/486, E29.271
See application file for complete search history.

(56) References Cited

U.S. PATENT DOCUMENTS

| | | | |
|---|---|---|---|
| 3,718,916 A | 2/1973 | Wada et al. | |
| 5,177,568 A | 1/1993 | Honma et al. | |
| 6,044,011 A * | 3/2000 | Marr et al. | 365/154 |
| 6,130,461 A | 10/2000 | Oowaki et al. | |
| 6,353,251 B1 | 3/2002 | Kimura | |
| 6,687,152 B2 | 2/2004 | Ohsawa | |
| 6,714,436 B1 | 3/2004 | Burnett et al. | |
| 6,835,619 B2 | 12/2004 | Prall | |
| 6,861,689 B2 | 3/2005 | Burnett | |
| 6,903,969 B2 * | 6/2005 | Bhattacharyya | 365/185.08 |
| 6,937,516 B2 | 8/2005 | Fazan et al. | |
| 7,115,948 B2 | 10/2006 | Bhattacharyya | |
| 7,238,555 B2 | 7/2007 | Orlowski et al. | |
| 2004/0026749 A1 | 2/2004 | Ohsawa | |
| 2004/0124488 A1 | 7/2004 | Fazan et al. | |
| 2004/0142579 A1 | 7/2004 | Morita et al. | |
| 2004/0262667 A1 | 12/2004 | Bhattacharyya | |
| 2005/0001232 A1 | 1/2005 | Bhattacharyya | |
| 2005/0077574 A1 | 4/2005 | Mouli | |
| 2006/0125010 A1 | 6/2006 | Bhattacharyya | |
| 2006/0125041 A1* | 6/2006 | Yang et al. | 257/476 |
| 2006/0125121 A1 | 6/2006 | Ko et al. | |

(Continued)

FOREIGN PATENT DOCUMENTS

CN    1815742 A    8/2006

(Continued)

OTHER PUBLICATIONS

EPC Application No. 07841573.4, Supplemental Search Report PCT/US2007/077170, dated Sep. 17, 2009.

(Continued)

*Primary Examiner* — Kenneth Parker
*Assistant Examiner* — Paul Budd
(74) *Attorney, Agent, or Firm* — Joanna G. Chiu

(57) ABSTRACT

A one-transistor dynamic random access memory (DRAM) cell includes a transistor which has a first source/drain region, a second source/drain region, a body region between the first and second source/drain regions, and a gate over the body region. The first source/drain region includes a Schottky diode junction with the body region and the second source/drain region includes an n-p diode junction with the body region.

18 Claims, 2 Drawing Sheets

U.S. PATENT DOCUMENTS

2006/0240653 A1   10/2006   Bhattacharyya

FOREIGN PATENT DOCUMENTS

| CN | 1815742 A | 3/2009 |
|---|---|---|
| EP | 1355361 A1 | 10/2003 |
| EP | 1357603 A2 | 10/2003 |

OTHER PUBLICATIONS

International Search Report for correlating PCT Patent Application No. PCT/US07/77170 dated Mar. 10, 2008.

Fazan et al., "A Simple 1-Transistor Capacitor-Less Memory Cell for High Performance Embedded DRAMS", IEEE CICC< 2002, pp. 99-102.

Ohsawa et al., "Memory Design Using a One-Transistor Gain Cell on SOI", IEEE SSC, Nov. 2002, pp. 1510-1522, vol. 37, No. 11.

Yoshinda et al., "A Design of a Capacitorless 1T-DRAM Cell Using Gate-Induced Drain Leakage (GIDL) Current for Low-power and High-speed Embedded Memory", IEEE IEDM, 2003, p. 913.

Kuo et al., "A Capacitorless Double-Gate DRAM Cell", IEEE EDL, Jun. 2002, pp. 345-347, vol. 23, No. 6.

Okhonin et al., "A Capacitor-Less 1T-DRAM Cell", Feb. 2002, pp. 85-87, vol. 23, No. 2.

Inoh et al., "FBC (Floating Body Cell) for Embedded DRAM on SOI", 2003, pp. 63-64, Symposium on VLSI Technology Digest of Technical Papers.

\* cited by examiner

METHOD FOR FORMING ONE TRANSISTOR DRAM CELL STRUCTURE

FIELD OF THE INVENTION

The invention relates in general to semiconductor devices, and in particular to a DRAM cell having one transistor.

RELATED ART

DRAMs (dynamic random access memories) in general have enjoyed great success primarily due to the high density with good speed. In the quest for even higher density, a technique for single transistor DRAMs has been developed. The individual cell is provided in a semiconductor on insulator (SOI) substrate or on a bulk substrate with isolated transistor bodies and requires only a single transistor, doing away with the need for the capacitor that has historically been used in DRAMs. These types of DRAM cells are also known as capacitorless DRAM cells because of not requiring a capacitor. In such a single transistor DRAM cell, the body of the transistor is left floating and, because the bodies of the transistors are isolated from each other, charge is accumulated in the body. This alters the threshold of the transistor, and such difference can be detected.

The technique for writing is, for N channel transistors which are the typical case, to generate holes that remain trapped in the body of the transistor, which is electrically floating. This is achieved by selecting the gate, source and drain voltages so that the transistor operates to achieve greater hole/electron pair generation than removal of the holes. For erasing, the holes are removed also by adjusting the gate, source and drain voltages so that hole removal occurs faster than hole/electron pair generation. One of the difficulties has been in achieving both writing and erasing with sufficient speed. If the hole removal is not sufficiently faster than hole/electron pair generation in the erase mode, then the erase is too slow. Similarly, if in the write mode the hole/electron generation is not sufficiently faster than the hole removal, then the write is too slow. It has been a problem to get sufficient speed for both reads and writes. Thus, there is a need to find a technique for achieving sufficient speed for both read operations and write operations.

BRIEF DESCRIPTION OF THE DRAWINGS

The present invention is illustrated by way of example and not limited by the accompanying figures, in which like references indicate similar elements, and in which.

Figure 1:
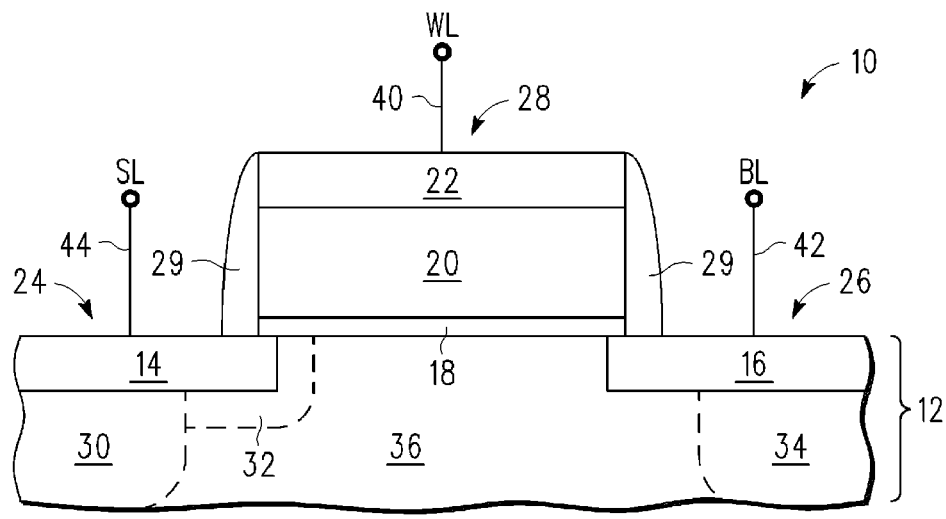
FIG. 1 illustrates a cross-sectional view of a device during a stage in its manufacture in accordance with one embodiment.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

For a thorough understanding of the subject One Transistor DRAM Cell Structure and Method for Forming, reference is made to the following Detailed Description, which includes the appended Claims, in conjunction with the above-described Drawings.

In a manner that will become eminently apparent below, the subject invention inheres, in one form, in a structure and method for programming a single-transistor capacitorless (1T/0C) memory cell. Specifically, the memory cell, which comprises a floating (i.e., isolated) body region, is programmed by modulating the threshold voltage, $V_T$, of a MOS transistor that includes the body region and respective drain and source regions. $V_T$ modulation is effected through the accumulation, as a result of band-to-band tunneling (BTBT), of majority carriers in the body region. Programming the memory cell in this manner is preferable to other known techniques in that, inter alia, generation of majority carriers by BTBT demands appreciably lower drain current.

One problem arises when purging the holes from the floating body region. A conventional n-p junction is limited in how efficiently holes may be removed from the body region. This is due to the relatively weak forward bias current of the n-p junction. As a result, after a write "0" operation to a (1T/0C) memory cell, the body potential is not sufficiently low to provide a robust read margin between the "0" and "1" states. As a result, there may be a problem in accurately distinguishing a subsequent read of a "0" and read of a "1" across all the bits in a large memory array. This problem may be especially pronounced for the outlying or tail bits of a large array of memory cells.

Some Schottky junctions may have a substantially larger forward bias current than an n-p junction, while still providing a sufficiently low reverse bias current. This substantially larger forward bias current allows holes to be more efficiently removed from the body region. As a result, after a write "0" operation to a (1T/0C) memory cell, the body potential is sufficiently low to provide a robust read margin between the "0" and "1" states. As a result, there should be less of a problem in accurately distinguishing a subsequent read of a "0" and read of a "1" across all the bits in a large memory array. This is especially helpful for the outlying or tail bits of a large array of memory cells.

Schottky junctions may have different barrier heights. In one embodiment, the barrier height of the Schottky junction is sufficiently low to provide strong forward current during a write "0" operation, but not so low that there is significant reverse leakage to disturb the data value stored in the (1T/0C) memory cell.

However, using a Schottky junction on the source side may cause significant problems during a read operation. During a read operation of a "1", the body to source junction is forward biased. If the source uses a Schottky junction, then the body loses its charge more quickly due to the substantially larger forward bias current of the Schottky junction. However, this time the quick loss of holes in the body region is a problem. The quick removal of holes in the body region may result in a read of a "1" causing the data to be lost. As a result, it is advantageous to use an n-p junction rather than a Schottky junction during a read operation.

Consequently, the forward bias of a Schottky junction may be used to provide an efficient removal of holes during a write "0" operation, and an n-p junction may be used at the source during the read operation to prevent the Schottky junction from causing a loss of data during a read "1" operation.

FIG. 1 illustrates a cross-sectional view of a device 10 during a stage in its manufacture in accordance with one embodiment. As may be seen in FIG. 1, a memory cell comprises a MOS transistor 10 formed on a substrate 12. Substrate 12 may be a SOI (silicon on insulator) substrate or a bulk substrate with a floating body region. Known fabrication techniques may be used to form a MOS (e.g. NMOS) transistor on substrate 12. The resulting device 10 comprises a body region 36 (e.g. of p-type conductivity). A drain region 26 (e.g. n-type) is formed at one end of body region 36, and a source region 24 (e.g. n-type) is formed at the opposite end of body region 36. In an alternate embodiment, a PMOS transistor may be formed instead of the NMOS transistor, with the appropriate changes in polarity. In the illustrated embodiment, a silicide layer 14 overlies source region 30 and a silicide layer 16 overlies a drain region 34. In some embodiments, a silicide region 22 may overlie a gate 20. Alternate embodiments may not use silicide layer 22.

Note that for some embodiment, the drain region 26 comprises a deep drain region 34, and source region 24 comprises a deep source region 30 and a source extension region 32. A gate structure or gate stack 28, comprising a gate silicide 22, a gate material 20, and gate dielectric 18, is disposed overlying body region 36. In a preferred embodiment, MOS transistor 10 is fabricated so that drain region 26 and source region 24 are self-aligned with gate stack 28. Finally, an interconnect system is provided that includes a word line (WL) 40 connected to gate stack 28, a bit line (BL) 42 connected to drain 26, and a source line (SL) 44 connected to source 24.

Note that in the illustrated embodiment, a silicide 14 is formed as part of source region 24 and a silicide 16 is formed as part of drain region 26. A source extension region 32 (n-type) is formed as part of source 24. The dopant concentration of source extension region 32 should be sufficiently high to provide an ohmic contact between the source-side silicide 14 and source extension region 32. In one embodiment, dopant concentrations in source regions 30, 32 and drain region 34 may be in the range of $3 \times 10^{19}$ to $3 \times 10^{20}$ atoms/cm$^3$, and dopant concentrations in body region 36 may be in the range of approximately $5 \times 10^{16}$ to $5 \times 10^{17}$ atoms/cm$^3$. Alternate embodiments may use different dopant concentrations.

A variety of methods may be used to form device 10 of FIG. 1. For example, an angled implant may be used to form source extension region 32. Referring to FIG. 1, the angled implant may diagonally approach device 10 from the source side (the left) at an angle from the vertical of approximately 45 degrees. Alternate embodiments may use an implant angle ranging from 0 degrees to the vertical (a vertical implant) to approximately 60 degrees to the vertical. Other methods used to form device 10 of FIG. 1 may use a vertical implant.

In one embodiment, a mask (not shown) may be used to mask off the drain side 26 so that the source extension region 32 is only formed on the source side. In this case, a vertical implant may be used to form source extension region 32 on the source side. Alternate embodiments may use a combination of masking and implant angle to produce the desired dopant profiles on the source and drain sides. Note that a mask used to mask off the drain side may be a modified extension implant mask, where the extension implant mask masked off the p-channel devices, and the modified extension implant mask masked off the p-channel devices and the drain regions of the n-channel devices. Thus the modified extension implant mask may be very easy and cheap to create for the manufacturing process.

Some methods used to form device 10 of FIG. 1 may utilize spacers (not shown) which may be sacrificial (i.e. removed for the final device) and which may be wider than the spacers 29 illustrated in FIG. 1. In different methods, the silicide layer comprising 14, 16, and 22 may be deposited before or after the implant of source extension region 32.

In one embodiment, the silicide layer may comprise one or more of the following materials: erbium silicide (ErSi$_x$), ytterbium silicide (YbSi$_x$), and/or platinum silicide (PtSi). Generally for an NMOS device, one or more of the following materials may be used: erbium silicide and/or ytterbium silicide. Generally for a PMOS device, platinum silicide may be used. In another embodiment, the silicide layer may include an ultrathin (approximately monolayer) insulator interposed at the silicide/silicon junction to adjust the barrier height by interface passivation. In one embodiment, the silicide materials chosen provide a sufficiently low barrier for desired operation of the Schottky junction. For some embodiments, low barrier materials may be defined to be materials that have barrier heights within approximately 400 millivolts of the conduction band edge for NMOS devices and within approximately 400 millivolts of the valence band edge for PMOS devices. For some embodiments, low barrier materials may be defined to be materials that have barrier heights within approximately 300 millivolts of the conduction band edge for NMOS devices and within approximately 300 millivolts of the valence band edge for PMOS devices. Alternate embodiments may use different materials and/or materials having different barriers for forming the Schottky junctions.

One example of a method used to form device 10 of FIG. 1 will now be described. An implant may be used to form source extension region 32. The implant may be a vertical implant using a masking layer (not shown) to block the implant on the drain side 26, or the implant may be an angled implant which uses the gate stack 28 to block the implant on the drain side 26. Note that sacrificial spacers (not shown) wider than spacers 29 may then be used during a subsequent implant to form the deep source region 30 and the deep drain region 34. These sacrificial spacers (not shown) may then be removed before depositing silicide layer 14, 16, and 22.

An alternate example of a method used to form device 10 of FIG. 1 will now be described. Silicide layer 14, 16, and 22 may be deposited. An implant may be used to form source extension region 32. The implant may be a vertical implant using a masking layer (not shown) to block the implant on the drain side 26, or the implant may be an angled implant which uses the gate stack 28 to block the implant on the drain side 26. Note that sacrificial spacers (not shown) wider than sidewall spacers 29 may then be used during a subsequent implant to form the deep source region 30 and the deep drain region 34. These sacrificial spacers may then be removed.

Note that the transistor 10 illustrated in FIG. 1 has an n-p junction in the source region 24 and a Schottky junction in the drain region 26. The n-p junction in the source region 24 is between n-type regions 30, 32 and p-type body 36. The Schottky junction in the drain region 26 is between the silicide layer 16 and the p-type body region 36.

Figure 2:
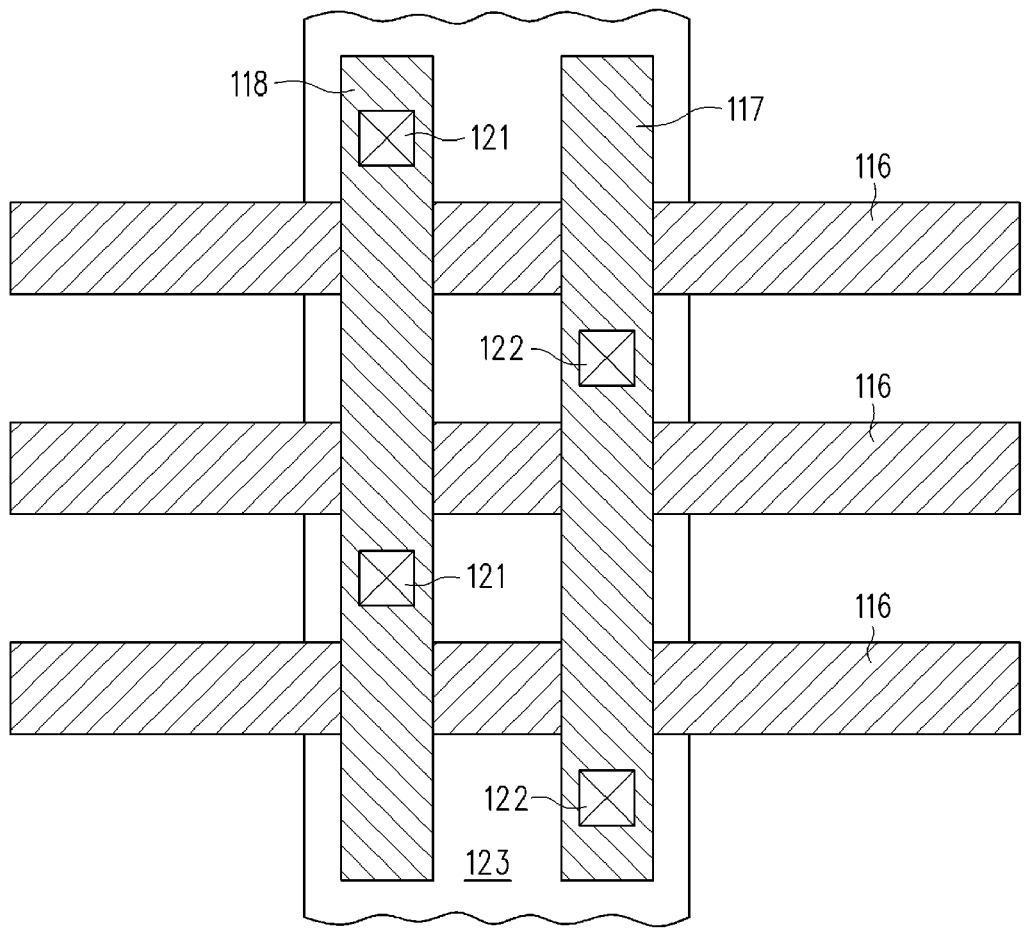
FIG. 2 illustrates a mask layout applicable to a memory cell utilizing a device of FIG. 1 in accordance with one embodiment.

FIG. 2 is a graphical representation of an operative mask layout for a semiconductor device in which there is fabricated a memory array that includes a number of memory cells 10. As illustrated in FIG. 2, a plurality of wordlines (WLs) 116 extend in a horizontal direction, substantially parallel to the surface of the device. Each WL 116 also constitutes the polysilicon gate conductor 20 of respective memory cells in a given row of a memory array. BL 117 and SL 118 extend over WLs 116 in a vertical direction. SL 118 is electrically connected to the source region 24 of each memory cell 10 in the array through a respective one of a requisite number of conductive vias 121. Similarly, BL 117 is electrically connected to the drain region 26 of each memory cell 10 in the array through a requisite number of conductive vias 122. The active areas of memory cells 10 are formed in active area 123 illustrated in FIG. 2.

Those experienced in the art of semiconductor memory design and fabrication appreciate that the RAM cell structure described immediately above requires an additional conductive element beyond that which is customarily provided. That is, conventional memory array architecture is satisfied by the inclusion of a single source line, for example. However, the requirement for an additional conductive trace is not deemed a significant detriment here. This is because the relatively low current produced by memory cell 10 requires a device width that is somewhat greater than would otherwise be indicated. That is, because the current differential between a memory cell at logic "1" and a memory cell at logic "0" tends to be small, the memory cells are designed to have greater than minimal width in order to enhance the current differential in a manner that comfortably drives downstream sense amplifiers. For example, doubling the device width may increase the on/off current differential from 5 microamps to 10 microamps, thereby relaxing the design performance requirements associated with the sense amplifiers. Consequently, an additional conductor in the vertical direction is accommodated with facility by the relatively larger device width.

In addition, the additional conductor is advantageous in the respect that it may be used to minimize leakage current that might arise on unselected WLs. Specifically, in the absence of SL 118, the sources of all cells are commonly connected by a metallic strap conductor that is in turn connected to a single reference voltage. Because the leakage current of unselected memory cells can approach nanoamps/device, and because a given column in the memory array may include several hundred memory cells (256 or 512, for example), then the aggregate worst-case leakage current may become comparable to the typical read current. As a countermeasure, a source bias may be applied to unselected cells in order to achieve hard turn-off. This is more readily accomplished when the turn-off bias is available for application on a column-by-column basis, rather than only globally on the entire array. Schemes for addressing the contents of a memory array utilizing device 10 are deemed largely collateral to the invention and are, accordingly, not treated here. However, certain details regarding methods of programming, erasing, and reading the contents of a memory array utilizing device 10 are relevant, and are discussed below.

Figure 3:
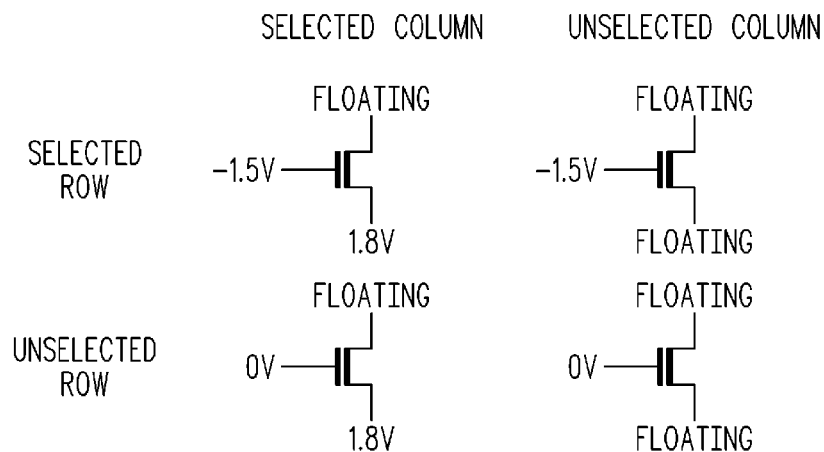
FIG. 3 illustrates a graphical representation of the manner in which a memory array utilizing a device of FIG. 1 may be biased during a write "1" operation in accordance with one embodiment.
Figure 4:
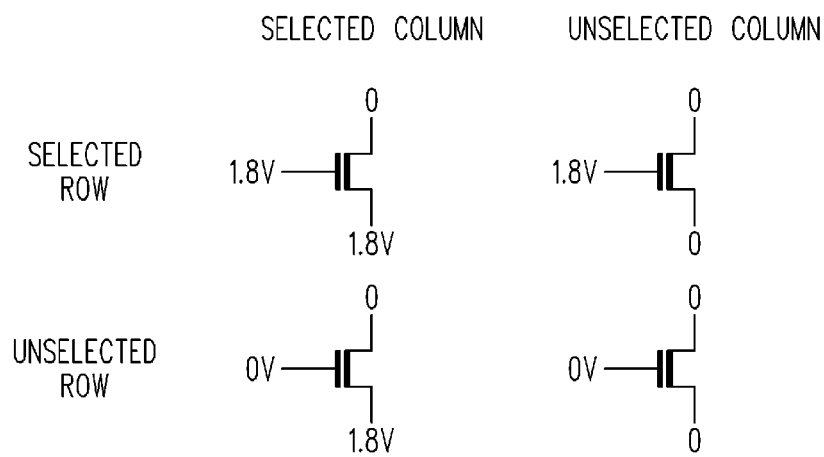
FIG. 4 illustrates a graphical representation of the manner in which a memory array utilizing a device of FIG. 1 may be biased during a write "0" operation in accordance with one embodiment.
Figure 5:
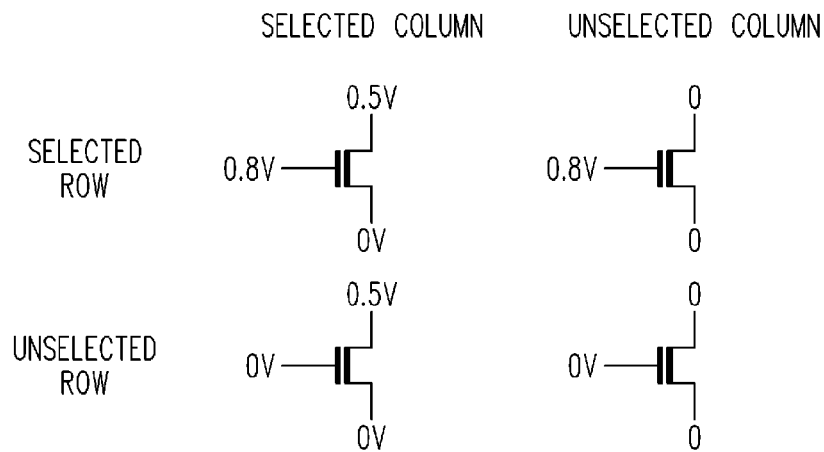
FIG. 5 illustrates a graphical representation of the manner in which a memory array utilizing a device of FIG. 1 may be biased during a read operation in accordance with one embodiment.

Consider now FIGS. 3, 4 and 5, which respectively illustrate alternative biasing techniques that may be used to write a desired logic level ("1", for example) to a RAM cell in accordance with the subject invention. It is not to be inferred, however, that the techniques disclosed in these FIGS. are exhaustive or exclusive.

FIG. 3 depicts an approach that may be used to write a "1" to the memory cell using device 10 in the selected row and column. This approach biases the Schottky junction in the drain region 26 so that holes are stored in the body region 36. In this approach, a positive voltage of 1.8V (Volts) is applied to the SL of cells in a selected column. A negative voltage of −1.5V is applied to the WL of a selected row. A voltage of 0V, or GND (ground), is applied to the WL of the unselected row. The voltage on the BL of the selected column is allowed to float. And the voltage on the SL and the BL of cells in unselected columns is allowed to float.

FIG. 4 depicts an approach that may be used to write a "0" to the memory cell using device 10 in the selected row and column. This approach biases the Schottky junction in the drain region 26 so that holes are purged and electrons stored in the body region 36. In this approach, a positive voltage of 1.8V (Volts) is applied to the SL of cells in a selected column. A positive voltage of 1.8V is applied to the WL of a selected row. A voltage of 0V, or GND (ground), is applied to the WL of the unselected row. A voltage of 0V, or GND (ground) is applied on the BL of the selected column. And a voltage of 0V, or GND (ground), is applied to the SL and the BL of cells in unselected columns.

FIG. 5 depicts an approach that may be used to read the memory cell using device 10 in the selected row and column. The n-p junction (between n-type 30, 32 and p-type body 36) is used at the source 24 during a read operation to reduce the probability that the Schottky junction (between silicide 16 and p-type body 36) may cause a loss of data during a read "1" operation. A read "0" operation does not generally have the same problem because storing a "0" does not require body 36 to store any appreciable charge. In this approach, a positive voltage of 0.5V (Volts) is applied to the BL of cells in a selected column. A positive voltage of 0.8V is applied to the WL of a selected row. A voltage of 0V, or GND (ground), is applied to the WL of the unselected row. A voltage of 0V, or GND (ground) is applied on the SL of the selected column. And a voltage of 0V, or GND (ground), is applied to the SL and the BL of cells in unselected columns.

Note that the actual values of the voltages described for FIGS. 3-5 above are for illustrative purposes only. As the dimensions of device 10 are scaled to larger or smaller dimensions, the values of the voltages will be scaled also. While the actual values of the voltages may change, the relationships between the voltages (e.g. which voltages are at a higher and lower potential) may remain the same. However, alternate embodiments may bias the devices 10 in a different manner in order to produce different behaviors from the devices 10.

Accordingly, from the Description above, it should be apparent that the subject one transistor DRAM cell is auspicious in respect of the many features, advantages and capabilities it enables. In particular, device 10 at once affords a simple and compact cell design, while supporting more robust write "0" operation and less detrimental read operation.

Statement 1. A one-transistor dynamic random access memory (DRAM) cell comprising:
 a transistor having a first source/drain region, a second source/drain region, a body region between the first and second source/drain regions, and a gate over the body region, wherein the first source/drain region includes a Schottky diode junction with the body region and the second source/drain region includes an n-p diode junction with the body region.

Statement 2. The DRAM cell of statement 1, wherein the second source/drain region includes an ohmic contact in series with the n-p diode junction.

Statement 3. The DRAM cell of statement 1, wherein:
 the first source/drain region includes a first silicide layer extending under the gate,
 the second source/drain region includes a second silicide layer extending under the gate and a source/drain extension region extending under the gate.

Statement 4. The DRAM cell of statement 3, wherein the Schottky diode junction with the body region is formed between the first silicide layer and the body region and the n-p diode junction with the body region is formed between the source/drain extension region and the body region.

Statement 5. The DRAM cell of statement 4, wherein the body region has a first conductivity type and the source/drain extension region has a second conductivity type, different from the first conductivity type.

Statement 6. The DRAM cell of statement 3, wherein each of the first and second source/drain regions include a deep source/drain region and wherein the first source/drain region is devoid of a source/drain extension region.

Statement 7. The DRAM cell of statement 1, wherein the Schottky diode junction removes majority carriers from the body region to write a first state during a first write operation of the DRAM cell.

Statement 8. The DRAM cell of statement 7, wherein when the transistor is characterized as an N-channel transistor, the majority carriers are removed from the body region in response to a potential at the first source/drain region being lower than a potential at the second source/drain region.

Statement 9. The DRAM cell of statement 7, wherein when the transistor is characterized as a P-channel transistor, the majority carriers are removed from the body region in response to a potential at the first source/drain region being higher than a potential at the second source/drain region.

Statement 10. The DRAM cell of statement 1, wherein when the transistor is characterized as an N-channel transistor, a stored value in the DRAM cell is sensed in response to a potential at the second source/drain region being lower than a potential at the first source/drain region.

Statement 11. The DRAM cell of statement 1, wherein when the transistor is characterized as a P-channel transistor, a stored value in the DRAM cell is sensed in response to a potential at the second source/drain region being higher than a potential at the first source/drain region.

Statement 12. The DRAM cell of statement 1, wherein the first source/drain region includes a first silicide layer extending under the gate and comprising a low-barrier silicide material for the majority carrier.

Statement 13. A one-transistor dynamic random access memory (DRAM) cell comprising:
 a transistor having a first source/drain region, a second source/drain region, a body region between the first and second source/drain regions, and a gate over the body region, wherein the first source/drain region includes a Schottky diode junction with the body region and the second source/drain region includes an n-p diode junction with the body region and an ohmic contact in series with the n-p diode junction,
 wherein:
  when the transistor is characterized as an N-channel transistor, the majority carriers are removed from the body region via the Schottky diode junction during a write operation of the DRAM cell in response to a potential at the first source/drain region being lower than a potential at the second source/drain region, and
  when the transistor is characterized as a P-channel transistor, the majority carriers are removed from the body region via the Schottky diode junction during a write operation of the DRAM cell in response to a potential at the first source/drain region being higher than a potential at the second source/drain region.

Statement 14. The DRAM cell of statement 13, wherein:
 the first source/drain region includes a first silicide layer extending under the gate,
 the second source/drain region includes a second silicide layer extending under the gate and a source/drain extension region extending under the gate, and
 the Schottky diode junction with the body region is formed between the first silicide layer and the body region and the n-p diode junction with the body region is formed between the source/drain extension region and the body region.

Statement 15. The DRAM cell of statement 14, wherein the first silicide layer is in physical contact with the body region and the second silicide layer is not in physical contact with the body region.

Statement 16. The DRAM cell of statement 13, wherein:
 when the transistor is characterized as an N-channel transistor, a stored value in the DRAM cell is sensed in response to a potential at the second source/drain region being lower than a potential at the first source/drain region, and
 when the transistor is characterized as an P-channel transistor, a stored value in the DRAM cell is sensed in response to a potential at the second source/drain region being higher than a potential at the first source/drain region.

Statement 17. The DRAM cell of statement 13, wherein the first source/drain region includes a first silicide layer extending under the gate and comprising a low-barrier silicide material for the majority carrier.

Statement 18. A method for forming a one-transistor dynamic random access memory (DRAM) cell, comprising:
 forming a gate over a body region of the DRAM memory cell, the body of the DRAM memory cell formed in a semiconductor layer having a first conductivity type;
 forming first and second source/drain regions in the semiconductor layer adjacent to, and on opposite sides of, the body region, wherein the first source/drain region includes a Schottky diode junction with the body region and the second source/drain region includes an n-p diode junction with the body region.

Statement 19. The method of statement 18, wherein:
 the first source/drain region includes a first silicide layer extending under the gate,
 the second source/drain region includes a second silicide layer extending under the gate and a source/drain extension region extending under the gate, the source/drain extension region having a second conductivity type, different from the first conductivity type, and
 the Schottky diode junction with the body region is formed between the first silicide layer and the body region and the n-p diode junction with the body region is formed between the source/drain extension region and the body region.

Statement 20. The method of statement 19, wherein the forming the first and second source/drain regions comprise forming deep source/drain regions in each of the first and second source/drain regions, and wherein the first source/drain region is devoid of a source/drain extension region such that the first silicide layer is in physical contact with the body region.

In the Description above, the invention has been set forth in the context of specific numerous embodiments, in a manner that is intended to be illustrative and to convey a thorough comprehension of the invention. However, one of ordinary skill in the art pertaining to the design and fabrication of semiconductor nonvolatile memory devices will appreciate that various modifications and changes may be imparted to the specifically described embodiments without departure from the scope of the invention. Consequently, the invention is to be understood as embracing all subject matter included within the literal scope of the appended Claims, as well as equivalents thereof. For example, the invention is not to be construed as limited to the specific materials and thicknesses identified herein. Similarly, those skilled in the art understand that conductivity types (P-type, N-type) and carrier types (holes, electrons) may, in general, be reversed, provided that requisite consistency is preserved. Accordingly, the Description and the Figures are properly construed as illustrative of the invention, rather than delimiting, and all modifications to or departures from them are consequently comprehended by the scope of the subject invention.

Although the device 10 of FIG. 1 has been described in the context of a memory cell, alternate embodiments may use device 10 in any desired and appropriate circuitry. For example, a transistor having one current electrode which comprises an n-p junction and having a second current electrode which comprises a Schottky diode may be used in any desired manner in any desired circuit and is in no way limited to usage in a memory array. This transistor may be biased in any desired manner to bring about a desired behavior.

Similarly, benefits, advantages, capabilities and solutions to operational or other technical challenges have been enumerated with respect to the specific embodiments of the invention, as provided herein. However, the benefits, advantages, capabilities and solutions, and any elements(s) or limitation(s) that give rise to any such benefit, advantage, capability and solution, or that enable or cause the same to become more pronounced, are not to be considered or construed as a critical, required, or essential element or limitation of any or all of the Claims, either expressly or by implication or estoppel. Furthermore, as used herein, the terms "comprises," "comprising," or any variation thereof, are intended to apply nonexclusively, so that a process, method, article or apparatus that comprises a recited enumeration of elements includes not only recited elements but also other elements not explicitly recited or enumerated but inherent to such process, method, article, or apparatus.

It should be understood that all circuitry described herein may be implemented either in silicon or another semiconductor material or alternatively by software code representation of silicon or another semiconductor material.

The invention claimed is:

1. A method for forming a one-transistor dynamic random access memory (DRAM) cell, comprising:
    forming a gate over a body region of the DRAM memory cell, the body of the DRAM memory cell formed in a semiconductor layer having a first conductivity type;
    forming first and second source/drain regions in the semiconductor layer adjacent to, and on opposite sides of, the body region, wherein the first source/drain region includes a Schottky diode junction with the body region and the second source/drain region includes an n-p diode junction with the body region, wherein
        the first source/drain region comprises a first silicide layer extending under the gate,
        the second source/drain region comprises a second silicide layer extending under the gate and a source/drain extension region extending under the gate, and
        the first source/drain region is devoid of a source/drain extension region.

2. The method of claim 1, wherein:
    the first source/drain region includes a first silicide layer extending under the gate,
    the second source/drain region includes a second silicide layer extending under the gate and a source/drain extension region extending under the gate, the source/drain extension region having a second conductivity type, different from the first conductivity type, and
    the Schottky diode junction with the body region is formed between the first silicide layer and the body region and the n-p diode junction with the body region is formed between the source/drain extension region and the body region.

3. The method of claim 1, wherein the forming the first and second source/drain regions comprise forming deep source/drain regions in each of the first and second source/drain regions, and wherein the first source/drain region is devoid of a source/drain extension region such that the first silicide layer is in physical contact with the body region.

4. A method for forming a one-transistor dynamic random access memory (DRAM) cell, comprising:
    forming a transistor having a first source/drain region, a second source/drain region, a body region between the first and second source/drain regions, and a gate over the body region, wherein the first source/drain region comprises a Schottky diode junction with the body region and the second source/drain region comprises an n-p diode junction with the body region,
    wherein the first source/drain region comprises a first silicide layer extending under the gate,
    the second source/drain region comprises a second silicide layer extending under the gate and a source/drain extension region extending under the gate,
    wherein each of the first and second source/drain regions comprise a deep source/drain region and wherein the first source/drain region is devoid of a source/drain extension region.

5. The method of claim 4, wherein the second source/drain region comprises an ohmic contact in series with the n-p diode junction.

6. The method of claim 4, wherein the Schottky diode junction with the body region is formed between the first silicide layer and the body region and the n-p diode junction with the body region is formed between the source/drain extension region and the body region.

7. The method of claim 6, wherein the body region has a first conductivity type and the source/drain extension region has a second conductivity type, different from the first conductivity type.

8. The method of claim 4, wherein the Schottky diode junction removes majority carriers from the body region to write a first state during a first write operation of the DRAM cell.

9. The method of claim 8, wherein when the transistor is characterized as an N-channel transistor, the majority carriers are removed from the body region in response to a potential at the first source/drain region being lower than a potential at the second source/drain region.

10. The method of claim 8, wherein when the transistor is characterized as a P-channel transistor, the majority carriers are removed from the body region in response to a potential at the first source/drain region being higher than a potential at the second source/drain region.

11. The method of claim 4, wherein when the transistor is characterized as an N-channel transistor, a stored value in the DRAM cell is sensed in response to a potential at the second source/drain region being lower than a potential at the first source/drain region.

12. The method of claim 4, wherein when the transistor is characterized as a P-channel transistor, a stored value in the DRAM cell is sensed in response to a potential at the second source/drain region being higher than a potential at the first source/drain region.

13. The method of claim 4, wherein the first silicide layer extending under the gate comprises a low-barrier silicide material for the majority carrier.

14. A method for forming a one-transistor dynamic random access memory (DRAM) cell, comprising:
    forming a transistor having a first source/drain region, a second source/drain region, a body region between the first and second source/drain regions, and a gate over the body region, wherein the first source/drain region comprises a Schottky diode junction with the body region and the second source/drain region comprises an n-p diode junction with the body region and an ohmic contact in series with the n-p diode junction,
    wherein the first source/drain region comprises a first silicide layer extending under the gate,
    the second source/drain region comprises a second silicide layer extending under the gate and a source/drain extension region extending under the gate,
    wherein each of the first and second source/drain regions comprise a deep source/drain region and wherein the first source/drain region is devoid of a source/drain extension region, and
    wherein:
        when the transistor is characterized as an N-channel transistor, the majority carriers are removed from the body region via the Schottky diode junction during a write operation of the DRAM cell in response to a potential at the first source/drain region being lower than a potential at the second source/drain region, and
        when the transistor is characterized as a P-channel transistor, the majority carriers are removed from the body region via the Schottky diode junction during a write operation of the DRAM cell in response to a potential at the first source/drain region being higher than a potential at the second source/drain region.

15. The method of claim 14, wherein:
    the Schottky diode junction with the body region is formed between the first silicide layer and the body region and the n-p diode junction with the body region is formed between the source/drain extension region and the body region.

16. The method of claim 14, wherein the first silicide layer is in physical contact with the body region and the second silicide layer is not in physical contact with the body region.

17. The method of claim 14, wherein:
    when the transistor is characterized as an N-channel transistor, a stored value in the DRAM cell is sensed in response to a potential at the second source/drain region being lower than a potential at the first source/drain region, and
    when the transistor is characterized as an P-channel transistor, a stored value in the DRAM cell is sensed in response to a potential at the second source/drain region being higher than a potential at the first source/drain region.

18. The method of claim 14, wherein the first silicide layer extending under the gate comprises a low-barrier silicide material for the majority carrier.

\* \* \* \* \*